United States Patent [19]

Pedersen

[11] 3,723,906

[45] Mar. 27, 1973

[54] UHF OSCILLATOR

[75] Inventor: Arne R. Pedersen, Chicago, Ill.

[73] Assignee: Zenith Radio Corporation, Chicago, Ill.

[22] Filed: Feb. 26, 1971

[21] Appl. No.: 119,324

[52] U.S. Cl. ..........331/117 D, 331/109, 331/177 V, 334/15

[51] Int. Cl. ..........H03b 5/18

[58] Field of Search ....331/117 D, 36 C, 109, 177 V; 332/30 V; 334/15

[56] References Cited

UNITED STATES PATENTS

| | | | |
|---|---|---|---|
| 3,204,198 | 8/1965 | Bachnick | 331/117 D |
| 3,262,072 | 7/1966 | Crandall | 334/15 |
| 3,370,254 | 2/1968 | Keller | 331/36 C |

FOREIGN PATENTS OR APPLICATIONS

| | | | |
|---|---|---|---|
| 1,478,676 | 3/1967 | France | 331/117 D |
| 2,003,205 | 11/1969 | France | 331/117 D |

*Primary Examiner*—John Kominski

*Attorney*—Francis W. Crotty and Cornelius J. O'Connor

[57] ABSTRACT

A UHF transistor oscillator for a television tuner employs a voltage dependent variable capacitance (varactor) element in the feedback circuit coupled between the output and input circuits of the transistor. An adjustable control circuit, which connects the varactor to a source of D.C. potential, serves to vary the capacitance exhibited by varactor in the feedback circuit while simultaneously changing the reactive contribution of the varactor to the transistor input circuit.

3 Claims, 1 Drawing Figure

Patented March 27, 1973 3,723,906
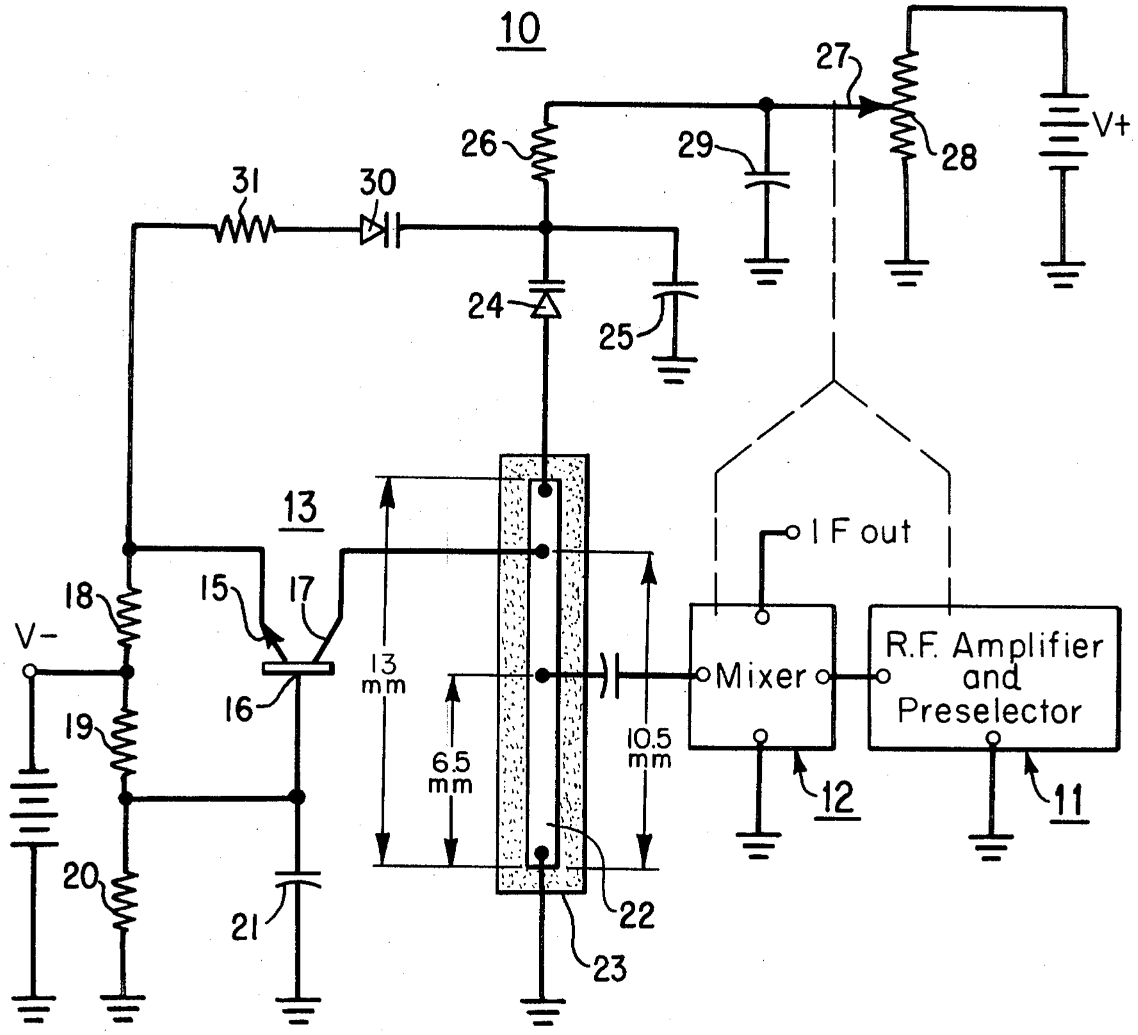
Inventor
Arne R. Pedersen
By Cornelius J. O'Connor
attorney

UHF OSCILLATOR

BACKGROUND OF THE INVENTION

This invention relates in general to oscillators and in particular to a novel UHF transistor oscillator for use in a television tuner.

The function of a UHF television tuner, of course, is to select a desired channel within the UHF band, a spectrum ranging from 470 to 890 MHz. Capacitively tuned transmission lines have been widely adopted for the tunable resonant circuits in such tuners. The local oscillator employed in such a tuner is conventionally operated at 45 MHz above the selected signal carrier in order to permit the heterodyning, or mixer circuit to derive a 45 MHz intermediate frequency (IF) signal. Therefore, the oscillator must be capable of tuning through a range extending from approximately 515 to 935 MHz.

In tuning across a bandwidth of this magnitude, a properly designed feedback arrangement from the output to the input circuit of the oscillator active device is required in order to achieve sufficient output power from the oscillator at both extremities of the band. In this regard it is desirable, particularly in the case of a transistor oscillator, that the input terminal of the device see a capacitive load throughout its tuning range. It is the practice to employ a fixed capacitor for the feedback function, the value of which is selected to effect acceptable feedback across the band. It is characteristic of tunable oscillators operating in the UHF band that the magnitude of feedback required differs significantly at opposite ends of the band. This obtains by virtue of the fact that the impedance exhibited by the feedback capacitor at the low end of the band is almost twice the impedance it offers at the high end. This, of course, is attributable to the fact that the UHF oscillator range (515 to 935 MHz) covers a frequency spread of almost 2:1. It follows, therefore, that a greater amount of feedback is required at the low frequency end of the band if the output power of the oscillator is to be maintained at a relatively constant level. A constant oscillator output is desired, among other reasons, in order to provide a constant level of signal injection into the mixer circuit.

In view of these considerations, the external feedback capacitor in a transistor oscillator desirably should exhibit different capacitances at different portions of the UHF band. It is readily apparent, therefore, that the prior art practice of utilizing a fixed value capacitor as a feedback component constitutes a compromise, and as such, does not enable the oscillator to approach a constant output level nor, for that reason, permit most efficient operation of the transistor.

OBJECTS AND SUMMARY OF THE INVENTION

It is therefore a general object of the invention to provide a novel wide band oscillator.

It is a particular object of the invention to provide an improved UHF transistor oscillator.

It is a specific object of the invention to provide a transistor UHF oscillator having a novel feedback circuit.

A tunable UHF oscillator, constructed in accordance with the invention, comprises a transistor having first, second and third electrodes. An input circuit is coupled between the first and second electrodes while an output circuit is coupled between the second and third electrodes. The output circuit comprises a resonant circuit which has adjustable tuning means and includes an inductance element and a capacitance element. At least one of these elements is adjustable in response to actuation of the tuning means in order to tune the resonant circuit to a desired frequency in the oscillator range. A feedback circuit comprising a voltage-dependent variable capacitance element is coupled between the output circuit and the input circuit. A source of unidirectional potential is provided as a control circuit for connecting the voltage dependent capacitance element to that potential source. The control circuit, in response to actuation of the tuning means, varies the capacitance exhibited by the voltage dependent element in the feedback circuit while simul-taneously changing the reactive contribution of the voltage dependent element to the input circuit as the resonant circuit is tuned across the oscillator's frequency range.

BRIEF DESCRIPTION OF THE DRAWING

The features of the present invention which are believed to be novel are set forth with particularity in the appended claims. The invention, together with further objects and advantages thereof, may best be understood by reference to the following description in conjunction with the accompanying drawing in which the single FIGURE is a schematic representation, partially in block diagram form, of a UHF tuner utilizing an oscillator constructed in accordance with the invention.

DESCRIPTION OF A PREFERRED EMBODIMENT

The UHF tuner 10 shown in the drawing comprises a unable RF amplifier and preselector stage 11 for selecting a desired UHF channel, a mixer stage 12 having a tunable input circuit, and a variable frequency local oscillator 13 having a tuning control ganged to the tuning arrangement of the RF and mixer stages for conjoint adjustment therewith. The mixer derives an intermediate frequency (IF) output signal by heterodyning, in known fashion, a selected RF signal and a related locally generated oscillator signal.

Turning now to a more detailed consideration of the oscillator portion of the tuner, oscillator 13 is seen to comprise an NPN transistor having a first or emitter electrode 15, a second or base electrode 16, and a third electrode, collector 17. A string of serially arranged resistors 18, 19, 20 are connected between the emitter and a plane of reference potential, or ground. The juncture of resistors 18, 19 is returned to a source of negative biasing potential V- while the juncture of resistors 19, 20 is connected to base electrode 16 which, in turn, is returned to ground by an RF by-pass capacitor 21. Arranged in this fashion, an input circuit comprising resistor 18 and capacitor 21 is coupled between emitter 15 and base 16.

An output circuit comprising a resonant circuit, which serves as a tunable frequency selector, is coupled between collector 7 and the base electrode 16. As depicted, this resonant circuit comprises an inductor, which can take the form of a strip transmission line resonator, an arrangement comprising a strip 22 of conductive material deposited upon an alumina substrate 23 and having one extremity maintained at reference potential. The construction and theory of operation of strip-line resonators, as applied to microwave circuits, are reviewed in a paper entitled "-Microwave Integrated-Circuit Technology — A Survey", authored by Martin Caulton and Harold Sobol, and published in the *IEEE Journal of Solid-State Circuits*, Vol. SC–5, No. 6, December, 1970. For additional information, see the article entitled "UHF Tuner Design" appearing in the November, 1970 issue of *Wireless World*. The latter article is specifically addressed to the use of strip transmission lines in television tuners.

The resonant circuit of oscillator 13 further includes a voltage dependent variable capacitor 24, or a varactor as it is commonly designated, which serves as an adjustable capacitance element. The anode terminal of the varactor is connected to the upper extremity of inductor strip 22 while its cathode is returned to reference potential through a padding capacitor 25. The cathode of varactor 24 is also connected through a resistor 26 to the tap 27 of a variable resistor 28 which is shunted across a source of positive unidirectional potential, V+. A de-coupling capacitor 29 maintains tap 27 at reference potential, insofar as RF signals as well as 60 Hz hum and other interfering signals are concerned. Since a variation of the potential applied across varactor 24 serves to vary its capacitance, that element constitutes the adjustable component of the resonant circuit while variable resistor 28, in conjunction with the potential source V+, constitutes a tuning means for the resonant circuit. The broken construction lines extending from tap 27 to RF amplifier stage 11 and to mixer stage 13 symbolically designate that the tuning means for the oscillator is ganged to the tuning arrangement employed in the RF and mixer stages.

While the tunable resonant circuit for oscillator 13 has been depicted as a strip line resonator it should be emphasized that the type of resonant circuit employed is of no particular consequence, that is to say, a conventional capacity-tuned quarter-wave transmission line or coil can be substituted for the strip line resonator, insofar as the subject invention is concerned. For example, the tunable circuit for the oscillator, as well as the other tunable circuits of the tuner, may adopt the tuned transmission line arrangements shown in copending application Ser. No. 794,518, filed Jan. 28, 1969, in the name of David A. Blass and assigned to the same assignee as the subject invention.

A feedback circuit comprising a voltage dependent variable capacitance element or varactor 30, together with a resistor 31 is coupled between the output circuit and the input circuit. More particularly, the cathode terminal of the feedback varactor 30 is returned to the cathode of tuning varactor 24 while the anode of the feedback varactor is connected through damping resistor 31 to the emitter electrode of the transistor. In this fashion, a feedback circuit is established between the tunable resonant circuit 22, 24 and the emitter input circuit of the transistor.

Before proceeding to an explanation of the operation of oscillator 13, the biasing arrangement for the tuning and feedback varactors should first be noted. Insofar as tuning varactor 24 is concerned it is connected, via resistor 26, directly across the tapped portion of the positive voltage source V+ so that adjusting tap 27 from the high potential terminal of resistor 28 toward its low potential terminal varies the reverse or back bias applied across varactor 24 from a maximum back bias to minimum bias. As a result, the capacitance exhibited by tuning varactor 24 varies, correspondingly, from a minimum value to a maximum and the resonant frequency of the tuned circuit in which it is included varies from the high end of the UHF band to the low end.

Turning then to the feedback varactor 30, it is noted that this element is effectively connected in series with the positive and negative voltage sources. In this arrangement the feedback varactor always supports a larger back bias than the tuning varactor. Therefore, although their respective values vary in unison with adjustment of tap 27, for any particular setting of control 27, the feedback varactor will always exhibit a smaller capacitance than the tuning varactor, provided similar type varactors are used.

The operation of UHF oscillator 13 will now be considered. Assume, for the purpose of illustration, that the adjustable tap 27 is positioned as shown, i.e. approximately midway between the limits of its travel. Actually, in practice, the tap would not be permitted to reduce the voltage across tuning varactor 24 to zero since this would lead to degraded operation of the oscillator. In any event, with tap 27 thus positioned, and an emitter-base bias selected for the transistor by resistor 18 and voltage divider 19, 20, the oscillator will initiate oscillation somewhere in mid-band. Since the principles of a transistor oscillator are well known, suffice it to say that the transistor operates as an amplifying device that drives the resonant circuit 22, 24. When the output of the transistor is sufficient to feed back enough energy to overcome transistor and circuit power losses, the transistor amplifier functions as a transistor oscillator.

Upon meeting the aforesaid conditions for oscillation, and assuming that the oscillator is operating somewhere in the vicinity of mid-band, in order to tune a channel at the high end of the UHF band the tap 27 is adjusted so as to apply a more positive voltage across tuning varactor 24 and feedback varactor 30 and thereby reduce the capacitance exhibited by those devices. As tap 27 is adjusted the RF amplifier 11 and mixer 13 stages are simultaneously tuned by virtue of the illustrated ganging arrangement. In a practical realization of the invention the tuned circuits of the RF amplifier and mixer stages may also comprise varactor-tuned strip lines similar in construction to circuit 22, 24 but tailored to operate over a slightly different frequency range.

In any event, as the back bias across varactors 24 and 30 is increased to an upper limit, resonant circuit 22, 24 is tuned to the high end of the UHF band. Since this tuning operation is accompanied by a simultaneous reduction in the capacitance of feedback varactor 30, minimum feedback occurs at the high end of the band. On the other hand, if tap 27 is adjusted toward its other limit, back bias across both varactors is reduced. This bias reduction effects an increase in the capacitance exhibited by varactor 24 so that the resonant circuit 22, 24 is now tuned toward the lower end of the UHF band. Again, a simultaneous and corresponding change in the capacitance exhibited by feedback varactor 30 occurs so that the amount of feedback from collector to emitter is increased as the oscillator resonant circuit is tuned to the low frequency end of the band.

Concurrently with the above described change in feedback capacitance the reactive contribution of varactor 30 to the input circuit of the transistor changes. As previously noted, the emitter of the transistor desires to see a varying capacitive load throughout the oscillator tuning range. Accordingly, with the circuit parameters selected to provide the proper feedback capacitance for transistor oscillation at the high end of the UHF band, the disclosed feedback circuit insures that the reactive impedance seen by the emitter will always be capacitive and will vary in the desired manner since the capacitance exhibited by varactor 30 to the emitter increases in value as the oscillator resonant circuit is tuned from the high end of the band to the low end.

A UHF oscillator has been constructed in accordance with the schematic diagram shown in the drawing and has been found to give very satisfactory performance. Accordingly, to enable others to readily practice the invention, a table of values for the circuit elements is given below. Since other circuit variations will no doubt be suggested to those skilled in the art, the parameters presented are merely for the purpose of illustration and in no sense as a limitation of the described circuit:

| | |
|---|---|
| V+ | 30 volts |
| V– | 10 volts |
| NPN transistor | Fairchild MT-2060 |
| resistor 18 | 200 ohms |
| resistor 19 | 18 K ohms |
| resistor 20 | 10 K ohms |
| capacitor 21 | 200 pf |
| inductor 22 | 13 mm by .9mm conductor |
| substrate 23 | 0.6mm thick alumina |
| collector tap | 10.5 mm from bottom of line |
| mixer tap | 6.5 mm from bottom of line |
| tuning varactor 24 | BB105B diode |
| capacitor 25 | 40 pf |
| resistor 26 | 56 K ohms |
| resistor 28 | 10 K ohms |
| capacitor 29 | 20 μf |
| feedback varactor 30 | BB105B diode |
| resistor 31 | 12 ohms |

While a particular embodiment of the present invention has been shown and described, it is apparent that changes and modifications may be made therein without departing from the invention in its broad aspects. The aim of the apPended claims, therefore, is to cover all such changes and modifications as fall within the true spirit and scope of the invention.

I claim:

1. An oscillator tunable across a predetermined frequency range comprising:

a transistor having first, second and third electrodes;

an input circuit coupled between said first and second electrodes;

an output circuit coupled between said second and third electrodes and comprising a resonant circuit having adjustable tuning means and including an inductance element and a capacitance element, at least one of said elements being adjustable in response to actuation of said tuning means for tuning said resonant circuit to a desired frequency in said oscillator range;

a feedback circuit comprising a single capacitive coupling element consisting of a voltage-dependent capacitor coupled between said output circuit and said input circuit;

a first source of unidirectional potential;

a second source of unidirectional potential having a polarity opposite that of said first source;

and a control circuit connecting one terminal of said voltage dependent feedback capacitor to a terminus of a given polarity of said first source of unidirectional potential and for connecting the other terminal of said voltage dependent feedback capacitor to a terminus of said second source having a polarity opposite that of said given polarity, said control circuit being response to actuation of said tuning means, for varying the capacitance exhibited by said voltage dependent capacitor in said feedback circuit while simultaneously changing the reactive contribution of said voltage dependent feedback capacitor to said input circuit as said resonant circuit is tuned across said oscillator fre-quency range.

2. A tunable oscillator as set forth in claim 1 in which said first, second and third electrodes of said transistor comprise emitter, base and collector electrodes, respectively.

3. A tunable oscillator as set forth in claim 1 in which said adjustable element in said tunable resonant circuit comprises a voltage dependent capacitor, and in which said tuning voltage dependent capacitor is connected across said first source of potential and said feedback voltage dependent capacitor is connected across a series-opposing arrangement of said first potential source and said second potential source.

* * * * *